(12) United States Patent
Fujita et al.

(10) Patent No.: US 6,683,662 B2
(45) Date of Patent: Jan. 27, 2004

(54) SEMICONDUCTOR DEVICE AND METHOD FOR PRODUCING THE SAME

(75) Inventors: Akira Fujita, Tokyo (JP); Choei Sugitani, Tokyo (JP)

(73) Assignee: NEC LCD Technologies, Ltd. (JP)

(*) Notice: Subject to any disclaimer, the term of this patent is extended or adjusted under 35 U.S.C. 154(b) by 111 days.

(21) Appl. No.: 10/003,550

(22) Filed: Oct. 24, 2001

(65) Prior Publication Data

US 2002/0053667 A1 May 9, 2002

Related U.S. Application Data

(62) Division of application No. 09/671,414, filed on Sep. 27, 2000, now Pat. No. 6,323,931, which is a division of application No. 09/179,654, filed on Oct. 27, 1998, now Pat. No. 6,184,966.

(30) Foreign Application Priority Data

Oct. 28, 1997 (JP) .............................. 9-295208

(51) Int. Cl.$^7$ .................... G02F 1/136; G02F 1/333; H01L 21/66
(52) U.S. Cl. .............. 349/43; 349/40; 438/30
(58) Field of Search .................. 349/42, 43, 139, 349/187, 152, 149, 40; 257/59, 72; 438/30, 149

(56) References Cited

U.S. PATENT DOCUMENTS

| | | | | | |
|---|---|---|---|---|---|
| 5,636,329 | A | * | 6/1997 | Sukegawa et al. | 349/149 |
| 5,737,052 | A | * | 4/1998 | Kimura | 349/149 |
| 6,163,356 | A | * | 12/2000 | Song et al. | 349/152 |
| 6,400,425 | B1 | * | 6/2002 | Kim et al. | 349/40 |

* cited by examiner

Primary Examiner—Ming Toan T Ton
(74) Attorney, Agent, or Firm—Hayes Soloway P.C.

(57) ABSTRACT

An interterminal anti-short-circuiting pattern is formed in an upper metal wire included in a connection terminal 3, for connecting to external driving LSI and the like, located on the projected portion of a bottom glass substrate 2. This pattern includes recess 4 and island 5 on which a contact hole 12a is formed through a protective insulating film. The protective insulating film has high residence to water penetration. Spread of the corrosion can be shut off by the recess surrounding the island. Short circuit occurrence due to interterminal current leak can be inhibited under high moisture conditions in the semiconductor device used for active matrix display, e.g. LCD panel.

1 Claim, 9 Drawing Sheets

(UNIT: μm)

SEMICONDUCTOR DEVICE AND METHOD FOR PRODUCING THE SAME

CROSS-REFERENCE TO RELATED APPLICATIONS

This Application is a Divisional of U.S. application Ser. No. 09/671,414, filed Sep. 27, 2000, now U.S. Pat. No. 6,323,931, issued Nov. 27, 2001, which in turn is a Divisional of U.S. application Ser. No. 09/179,654, filed Oct. 27, 1998, now U.S. Pat. No. 6,184,966, issued Feb. 6, 2001.

FIELD OF THE INVENTION

The present invention relates to a semiconductor device such as color LCD (Liquid Crystal Display device) and the like in which an active matrix display unit is employed and a process for the production thereof, more especially, to an improved semiconductor device in respect of the connection terminal structure of projected wires at the portion connecting to an external driving circuit.

RELATED ART

A liquid crystal display device wherein an active matrix display method is adopted can realize displaying full-color images, displaying high-contrast images, and displaying detailed images with high resolution.

In a display device to which an active matrix display method is applied, matrix electrode and plural of pixel electrodes are formed on the inner surface of an electrode substrate which faces another electrode substrate. Every pixel electrode has a thin film transistor (TFT) mounted thereon as an active switching element. This TFT operates in accordance with a matrix formation to switch its corresponding pixel electrode therethrough.

In order to operate each of switching elements in accordance with the matrix formation through TFT, each of these elements is required to be connected to LSI and the like of an external driving circuit. Each connection terminal of wires constituting wiring of the matrix electrode including TFT switching elements and located on a projected portion of a liquid panel substrate is covered with a transparent conductive film of chemically stable ITO (Indium-Tin-Oxide).

FIG. 11 shows an exemplary conventional structure of such a connection terminal as mentioned above. FIG. 12 shows a side cross-sectional view taken along the line A—A of FIG. 11.

In the area between the jogged ends of top and bottom glass substrates 1, 2 wherein a connection element of a driving LSI is connected, a transparent conductive film 13 is deposited, and a metal wire 11 is formed therebeneath. In this case, the following problem will arise. Metal of the metal wire is easy to be ionized by water (moisture) penetrating through the transparent conductive film since the transparent conductive film is porous and less effective to shut off the infiltration of water under high humidity conditions. Consequently, metal corrosion occurs and the corroded metal leaches out between terminals to cause failure of interterminal current leak.

In order to solve this problem, this applicant (assignee) has proposed in Japanese Patent Kokai (Laid-open) No. JP-A-8-6059 (1996) an active matrix substrate in which an upper metal wire is removed of its terminal portion uncovered with an inorganic protective film or a connecting material connected to the terminal.

SUMMARY OF THE DISCLOSURE

However, in the active matrix substrate disclosed above there remains the following unsolved problem. When corrosion occurs in the portion of the upper metal wire to be connected to a wire of a plastic wire board, failure of interterminal current leak occurs at the same time. Explaining more in detail, the upper metal wire is generally covered with an anisotropic conductive film and connected to the wire of the flexible wire board via an anisotrapic conductive film by the tape-carrier package method. However, the anisotropic conductive film is water-absorbable to some extent so that water infiltrated through the anisotropic conductive film reacts with metal of the upper metal wire. In addition, in case that an impurity ion such as chlorine and the like is attached to either the anosotrapic conductive film or the flexible wire board, the attached impurity ion reacts with the metal. Consequently, metal corrosion occurs, and the corroded metal leaches out between the terminals to cause the failure of the interterminal current leak.

Accordingly, an object of the present invention is to provide a semiconductor device, including especially, active matrix liquid crystal display panel and the like, which is capable of inhibiting short circuit occurrence due to the interterminal current leak even under high humidity conditions, and a method for producing same.

According to an aspect of the present invention, there is provided a semiconductor device comprising plural lines of metal wires formed on a substrate each having a connection terminal positioned at the end of the substrate for connecting to an external driving circuit for applying voltage independently to every pixel electrode. The semiconductor device is characterized as follows: Each of the metal wires at the position of the connection terminal is provided with an interterminal anti-short-circuiting pattern including a conductive island and a recessor recesses located around the island; The surface of the metal wire except at least a portion of the island but including the inside of the recess thereon is covered with a protective insulating film; A contact hole is formed of the uncovered portion with the protective insulating film on the island; And a transparent conductive film is deposited on the surface of the protective insulating film including the inside of the contact hole and the top face of the island.

In this case, propagation of corrosion originating from the island formed on the connection terminal of the metal wire is intercepted by the recess, and accordingly, corrosion can be inhibited so as not to spread out of the island.

In an active matrix display method, matrix electrodes, plural pixel electrodes and active switching elements corresponding one by one to the pixel electrodes are used in being connected to each of metal electrodes except the aforementioned connection terminal end. The metal electrode except the connection terminal end constitutes a display portion on a substrate. Each of the pixel electrodes can be switched correspondingly to the matrix operation of the active switching elements. Liquid crystal is put into the space of the electrodes area located between the substrate and another substrate bonded opposing each other.

This constitution makes it possible to inhibit the occurrence of the interterminal current leak by the following reason. In the present invention, each of metal wires has an interterminal anti-short-circuiting pattern of conductive island and recess(es) on its connection terminal portion. Even though corrosion appears in the island area, the propagation of corrosion can be intercepted by the recess(es) located around the island, since the metal wire of a metal film except the island portion is covered with a protective insulating film effective to shut off the infiltration of water. Moreover, flow of metal eluted from island can also be stopped in the recess and never reaches outside. Accordingly, the occurrence of the interterminal current leak can be inhibited.

According to a second aspect of the present invention, there is provided a semiconductor device characterized by the following features.

Each of the metal wires at the position of said connection terminal is provided with an interterminal anti-short-circuiting pattern comprising conductive island and recess (es) located around said island; The surface of the metal wire except at least a portion of the island but including the inside of said recess(es) thereon are covered with a protective insulating film; A contact hole is formed of the uncovered portion with the protective insulating film on the island; A bottomed pool arriving at the recess is provided through the protective insulating film adjacent to said contact hole; A transparent conductive film is deposited on the surface of the protective insulating film, including inside of the contact hole and the bottomed pool.

According to a third aspect of the present invention, there is provided a semiconductor device characterized by the following features:

Each of said metal wires at the position of the connection terminal comprises an upper metal wire and a lower metal wire, with an interlaminer insulating film being interposed between the substrate and the lower metal wire; An interterminal anti-short-circuiting pattern comprising conductive island and recess(es) located around the island is provided at the same position of the upper and lower metal wires; The surface of the metal wire except at least a portion of the island but including the inside of the recess thereon is covered with a protective insulating film; Contact hole is formed of the uncovered portion with the protective insulating film on the island; A transparent conductive film is deposited on the surface of the protective insulating film including inside the contact hole and the top face of said island.

According to a further aspect of the present invention, there is provided a process for preparing a semiconductor device. The process comprises the following steps:

depositing a metal film by vacuum deposition or sputtering and removing partially the metal film to form the predetermined pattern of the metal wire;

forming an interterminal anti-short-circuiting pattern, comprising conductive islands and recess(es) located around the islands, at the position of the connection terminal to be formed;

depositing a protective insulating film on the surface of the metal wire except at least a portion of the island but including the inside of the recess thereon to provide a contact hole of the uncovered portion with the protective insulating film on the island; and depositing a transparent conductive film on the surface of the protective insulating film including inside the contact hole and the top face of the island.

According to a fifth aspect of the present invention, there is provided a process for preparing a semiconductor device comprising the steps of:

depositing a metal film by vacuum deposition or sputtering to form a predetermined pattern of the metal wire;

forming an interterminal anti-short-circuiting pattern, comprising conductive islands and recess(es) located around the islands, at the position of the connection terminal to be formed;

depositing a protective insulating film on the surface of the metal wire except at least a portion of the island but including the inside of the recess;

providing a contact hole of the uncovered portion with the protective insulating film on the island;

making a bottomed pool arriving at the recess through the protective insulating film adjacent to the contact hole; and depositing a transparent conductive film on the surface of the protective insulating film including the inside of the contact hole and the bottomed pool.

According to a sixth aspect of the present invention, there is provided a process for preparing a semiconductor device comprising the steps of:

forming an interlaminer insulating film on a glass substrate by sputtering;

depositing a metal film thereon by vacuum deposition or sputtering;

etching the metal film so as to form matrix electrodes on the central part of the glass plate, at the same time, to form the connection terminal having an interterminal anti-short-circuiting pattern on the periphery of the glass substrate, wherein the central part being to be changed into a display part, the interterminal anti-short-circuiting pattern comprising a conductive island, recess(es) and at least a constricted part which links the island to the recess(es), the connection terminal being coupled with the electrode formed on the central part;

forming a protective insulating film thereon by vacuum deposition or sputtering;

removing by etching partially the protective insulating film formed on the islands of the connection terminal, and the protective insulating film and the interlaminer insulating film formed on the recess(es);

depositing a transparent conductive film by vacuum deposition or sputtering; and etching the transparent conductive film into the predetermined shape of the connection terminal.

According to further aspects of the present invention, any of the aforementioned steps can be combined or eliminated for making up a modified process. Also any of the features aforementioned and those set forth in the dependent claims can be combined or eliminated for making up a modified semiconductor device.

PREFERRED EMBODIMENTS OF THE INVENTION

A liquid crystal display panel, which is one of the preferred embodiments of a semiconductor device of the present invention, and its production process will be explained in reference to the accompanying drawings.

Figure 1:
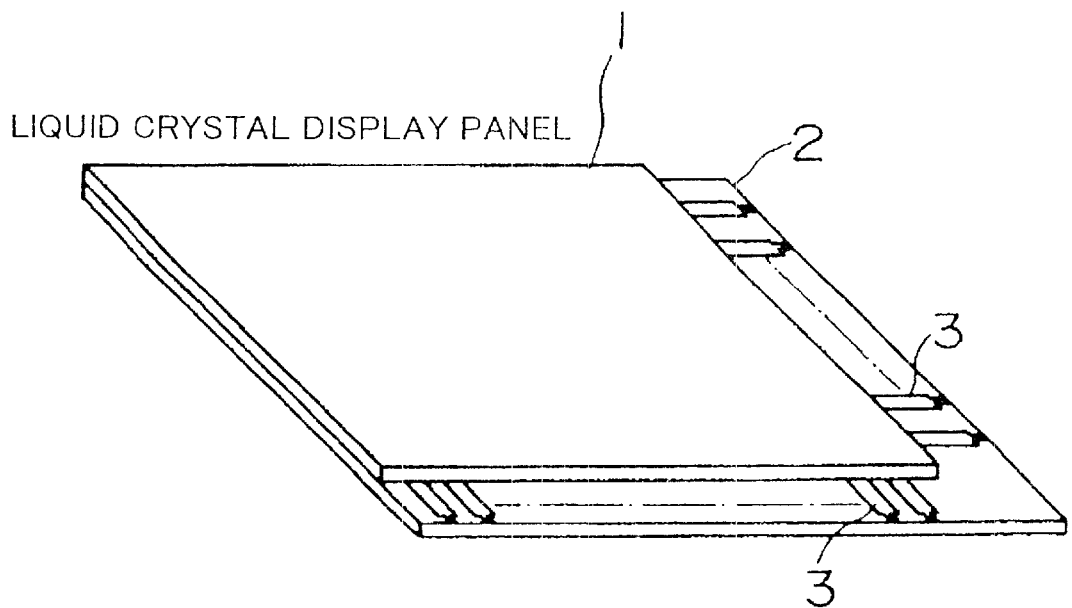
FIG. 1 is a perspective view of an assembled liquid crystal display panel which is an embodiment of a semiconductor device of the present invention.
Figure 2:
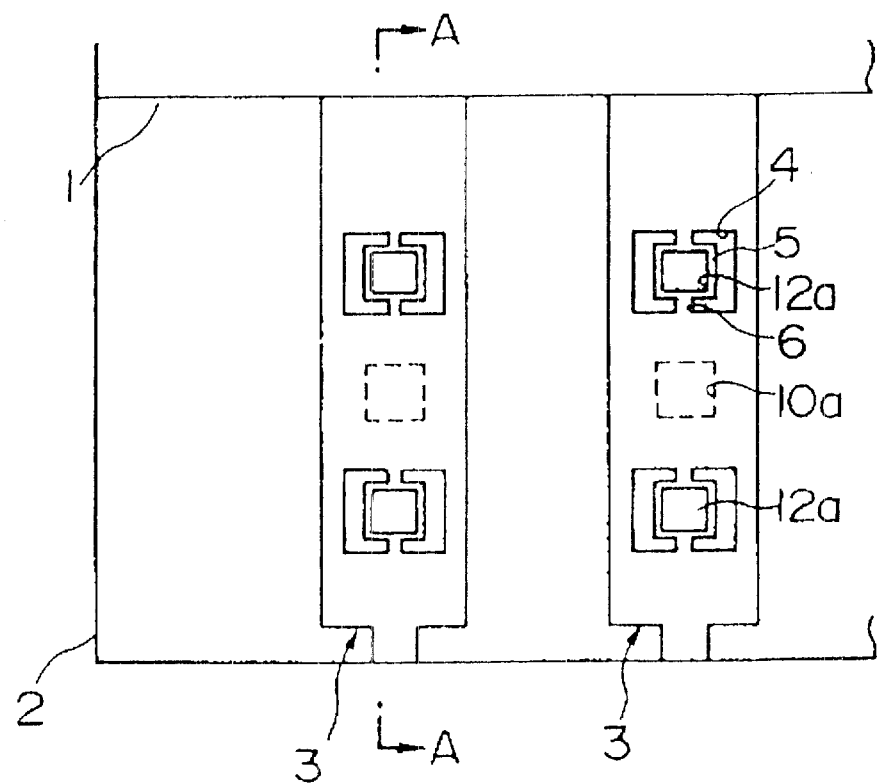
FIG. 2 is an enlarged plan showing a connection terminal according to a first embodiment of the present invention.
Figure 3:
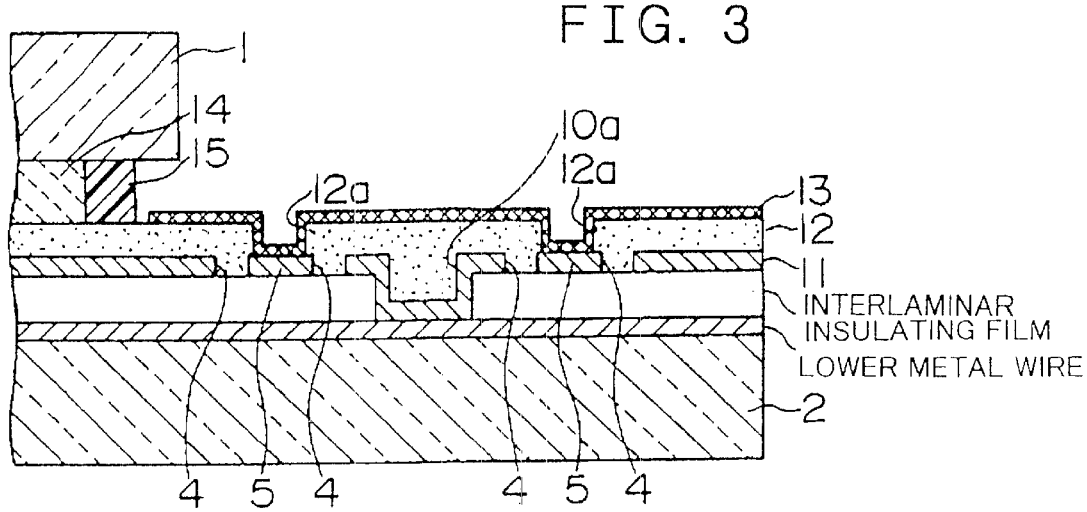
FIG. 3 is a cross-sectional side view taken in the line A—A of FIG. 2 showing the first embodiment of the present invention.
Figure 4:
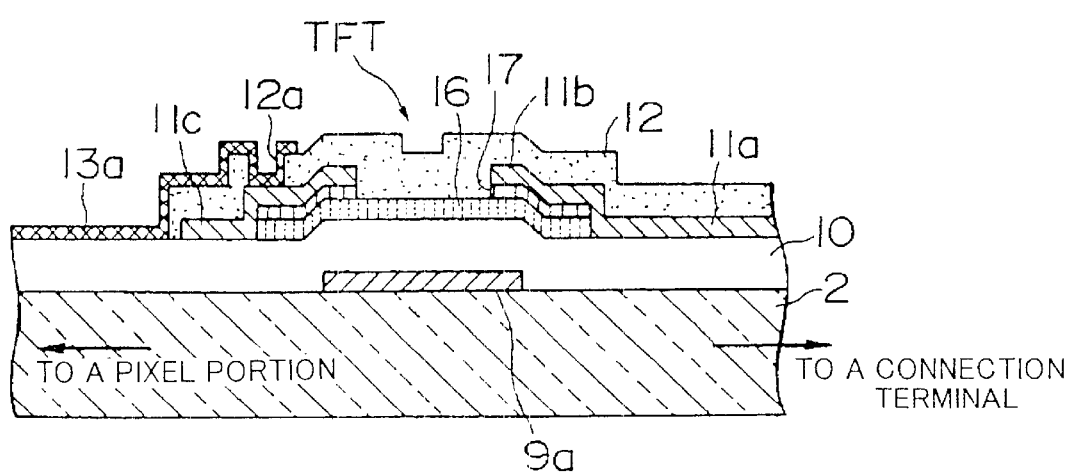
FIG. 4 is a cross-sectional view showing a TFT-forming portion of an active matrix liquid crystal display device.

FIGS. 1 to 6 shows the first embodiment of a liquid crystal display device of the present invention. FIG. 1 is a perspective view of the assembled panel; FIG. 2, a plan of a connection terminal; and FIG. 3, a cross-sectional view taken in the line A—A of FIG. 2. FIG. 4 is a cross-sectional view which shows a conventional pixel electrode portion having a TFTn and which is for assisting in understanding the explanation regarding the mode for carrying out the invention.

The constitution of the liquid crystal display panel will be made clear by the following explanation regarding a production process of the present invention so that it will be explained grossly here. As shown in FIG. 1, the liquid crystal display panel has top and bottom glass substrates 1 and 2. These substrates are adhered at spaces to each other with a sealing resin. A liquid crystal is encapsulated between these substrates to prepare a liquid crystal cell. On a top-substrate-facing side of the bottom glass substrate surface, metal wires constituting a pattern of an active matrix display electrode are formed. Each of metal wires has a connection terminal 3 located on the projected portion of the bottom glass substrate surface from the top glass substrate. These connection terminals are connected to a connection element such as driving LSI and the like.

Figure 5:
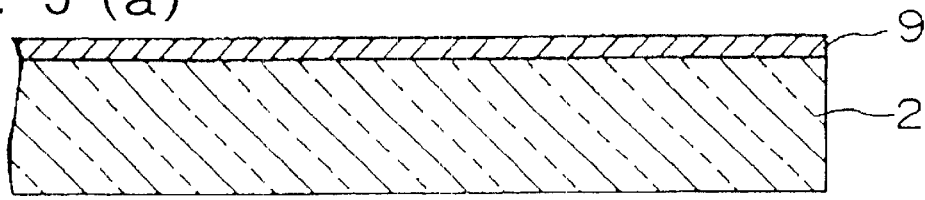
FIGS. 5(*a*) to (*e*) are a cross-sectional side view showing the production steps of the connection terminal according to the first embodiment of the present invention in this order.
Figure 5:
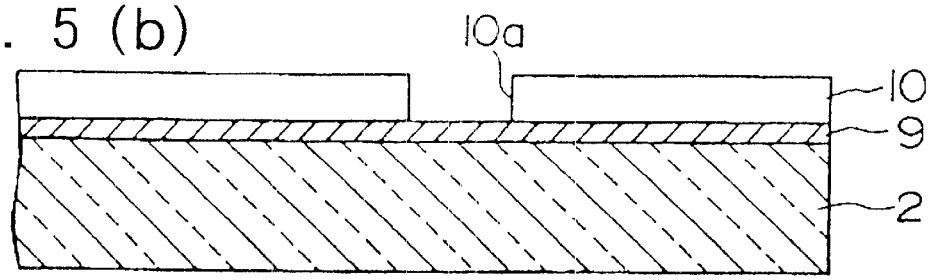
Figure 5:
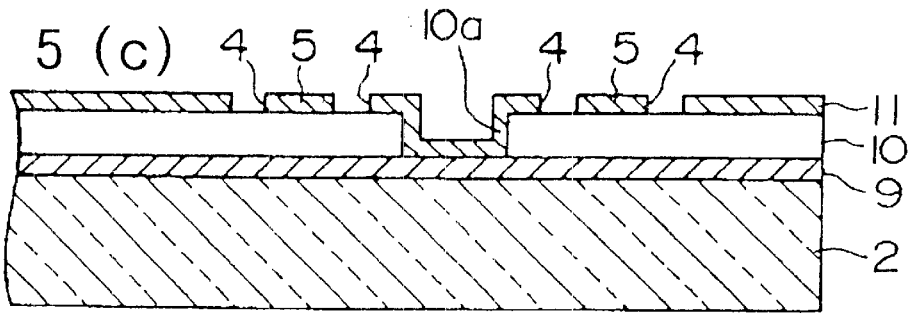
Figure 5:
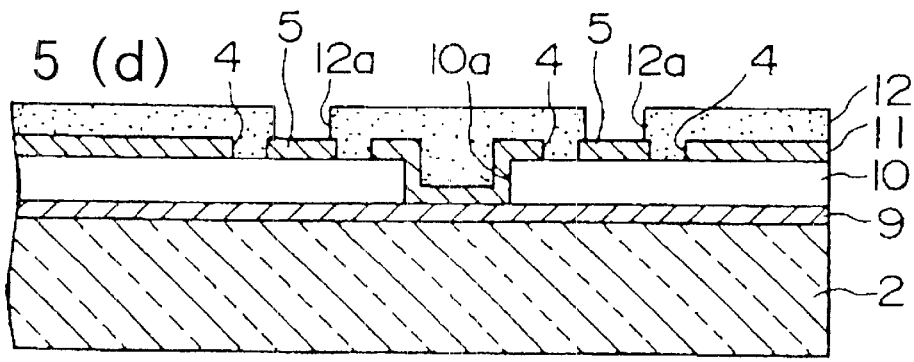
Figure 5:
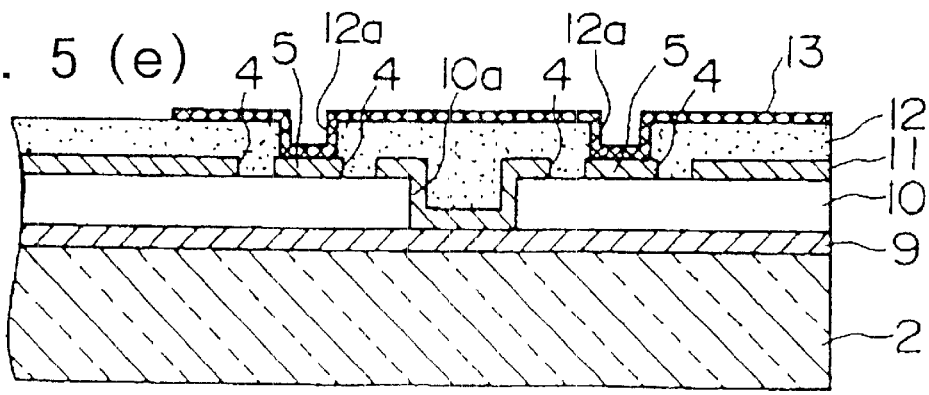

Next, a process for preparing this liquid crystal display panel, especially its improved connection terminal 3 located outside the top glass substrate 1 will be explained in reference to the attached drawings such as FIG. 1 and the like, mainly to FIG. 5 which is a production step diagram of cross-sectional views taken in the line A—A of FIG. 2.

Referring to FIG. 5(a), Cr (chromium) of 200 nm in thickness is deposited at first on the bottom glass substrate 2 by sputtering and then partially removed to form a pattern of lower metal wires 9. By each of these metal wires 9, a gate electrode 9a is formed in a TFT portion shown in FIG. 4.

Next, a composite film of silicon oxide and silicon nitride films having a thickness of 500 nm in total is deposited on the lower metal wire 9 by plasma CVD (Chemical Vapor Deposition) to form an interlaminar insulating (passivation) film 10 (FIG. 5(b)).

In the TFT portion shown in FIG. 4, amorphous silicon (hereinafter referred to as "a-Si") is subsequently deposited on the interlaminar insulating film 10 in the same CVD apparatus, and then doped to form undoped a-Si film 16 of 200 nm in thickness and grown up n$^+$-type a-Si film 17 of 20 nm. Consequently, the n$^+$-type a-Si film is partially removed to form an island pattern of the undoped a-Si film. The interlaminar insulating film 10 located beneath the island patern of the undoped a-Si film works as a gate insulating film.

On the other hand, referring to FIG. 5(b) and explaining in respect to the production process of the improved connection terminal 3 again, the deposited interlaminar insulating film 10 is partially removed at the predetermined position, wherein the lower metal wire 9 is to be in contact with an upper metal wire 11 which is to be formed in the next step (cf. FIG. 5(c)), to form a pattern of a contact hole 10a.

Referring to FIG. 5(c) which shows the next step of FIG. 5(b), an upper metal wire 11 made of Cr is deposited on the interlaminar insulating film 10 to cover the inside of the contact hole 10a. Explaining more in detail, Cr of 200 nm is deposited on the interlaminar insulating film 10 by sputtering to form the upper metal wire 11 electrically contacted to the lower metal wire 9 at the position of the contact hole 10a.

By the upper metal wire 11, drain electrode 11b and source electrode 11c are formed in the TFT-forming portion of FIG. 4; and a data signal wire 11a of the active matrix display device, in a display portion except the TFT-forming portion.

In the step of FIG. 5(c), which is essential to the production process of the improved connection terminal according to the present invention, the upper metal wire 11 is partially removed to form an interterminal anti-short-circuiting pattern of recesses 4 and conductive island 5. The island 5 is formed beneath a contact hole 12a (cf. FIG. 5(d)), which is made through a protective insulating film 12 in the next step, and surrounded by the recesses 4. As shown in FIG. 2 which is a plan of the terminal, the recesses 4 and the island 5 are linked by a constricted part 6.

In the next step of FIG. 5(d), a silicon nitride film of about 200 nm in thickness is deposited on the upper metal wire 11 having the interterminal anti-short-circuiting pattern of the recesses 4 and the island 5 by plasma CVD to form a protective insulating film 12. The protective insulating film 12 is partially removed to form a contact hole 12a on the connecting spot of the upper metal wire 11 which will be connected to a transparent conductive film 13 (cf. FIG. 5(e)) to be formed in the next step.

This contact hole 12a is formed just on the island 5 formed in the upper metal wire 11 and accordingly, surrounded by the recesses 4.

In the next step of FIG. 5(e), a transparent conductive film 13 made of ITO having a thickness of 40 nm is formed on the protective insulating film 12 so as to cover the inside of the contact hole 12a formed through the protective insulating film 12. FIG. 2 is a plan view of the connection terminal 3 completed through all the steps as mentioned above. It will be understood that a square drawn by a solid line 12a in FIG. 2 denotes the contact hole formed through the protective insulating film 12, and that drawn by a broken line 10a in FIG. 2 denotes the contact hole made through the interlaminar insulating film 10.

As shown in FIG. 4, which shows the TFT-forming portion, the transparent conductive film 13 in the display part is changed into a pattern of a pixel electrode 13 connected to the source electrode 11c.

By way of all the steps as mentioned above, the bottom glass substrate 2 having the connection terminal 3 thereon is manufactured. Subsequently, the resultant bottom glass substrate 2 is adhered to the top glass substrate 1 with a sealing resin 15 in such manner as shown in FIG. 3. Then a liquid crystal 14 is put into the space between the top and bottom glass substrates 1 and 2 to prepare the first embodiment of the liquid crystal display panel having plural connection terminals 3 located around the top glass substrate 1.

In the thus prepared first embodiment of the liquid crystal display panel of the present invention, the entire surface of the upper metal wire 11 except the conductive islands 5 in the interterminal anti-short-circuiting pattern is covered with the protective insulating film 12. Water hardly penetrates this protective insulating film 12 so that it is scarcely possible to cause corrosion in the area, of the upper metal wire 11, which is covered with the protective insulating film.

By the way, although the portion of island 5 uncovered with the protective insulating film 12 is also covered with the transparent conductive film 13, resistance to water penetration of the transparent conductive film 13 is not so high. On this account, it is possible to cause corrosion in the islands 5. However, the corrosion terminates only in the island and never propagate to other portion of the upper metal wire 11. Consequently, metal ion leaching out of the connection terminal 3 decreases and the shortcircuit occurrence probability due to innterterminal current leak can be greatly reduced by this anticorrosion effect as compared with the conventional structure similar to this semiconductor device of the present invention.

On the other hand, electrical resistance increases in proportion to the recesses 4 which surround the island 5 and are formed in order to prevent the interterminal short-circuiting of the upper metal wire 11. However, this problem can be solved and overcome by making electrical continuity between the upper metal wire 11 and the lower metal wire 9 by way of the contact hole 10a formed through the interlaminar insulating film 10.

A LCD was manufactured by using the first embodiment of the liquid crystal display panel of the present invention and its effect was investigated to obtain the following results.

Figure 6:
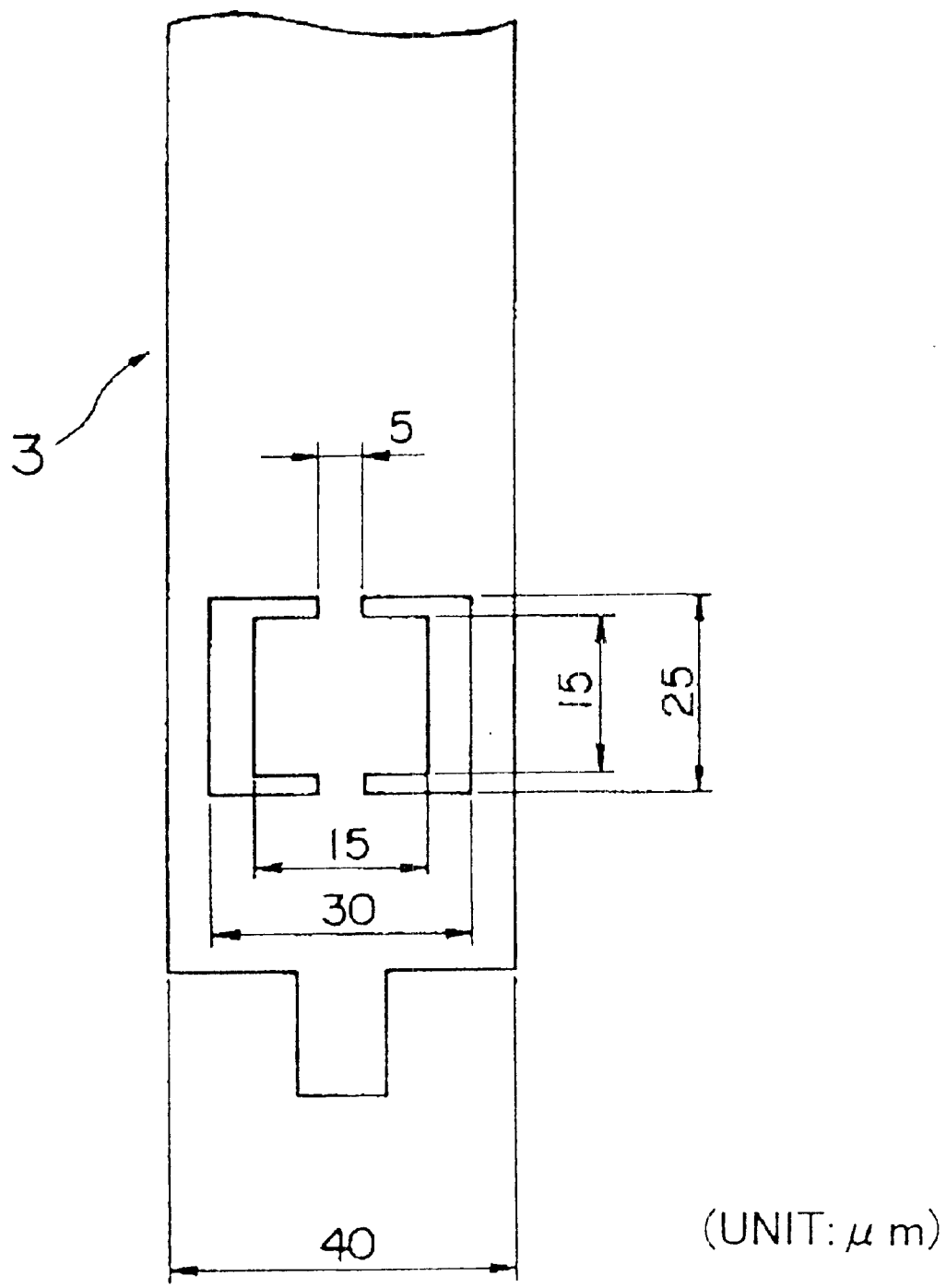
FIG. 6 is an enlarged plan showing an exemplary actual dimension of an essential part of an interterminal anti-short-circuiting pattern in the connection terminal according to the first embodiment of the present invention.

FIG. 6 shows an exemplary actual dimension of the portion around the island 5 of the upper metal wire 11 formed in the connection terminal 3. The interterminal pitch of the connection terminal was set to be 70 μm; the width of the terminal, 40 μm. The interterminal anti-short-circuit pattern having 8 spots of islands 5 relative to one upper metal wire 11 of the connection terminal 3 was formed.

The terminal of the thus obtained connection terminal 3 was contaminated intentionally by touching with a finger, and then connected to a connection element of a driving LSI through an anisotropic conductive film by pressure. The resultant liquid crystal display panel was actually operated under the conditions of 50° C. and 85% in humidity. After 240 hours lapsed from starting the operation, the liquid crystal panel was examined. As a result, with respect to the conventional liquid crystal display panel, interterminal short-circuiting was observed in the high ratio of 8 to 10 samples. In this contrast, no interterminal short-circuiting was observed in the first embodiment of the liquid crystal display panel of the present invention.

Figure 7:
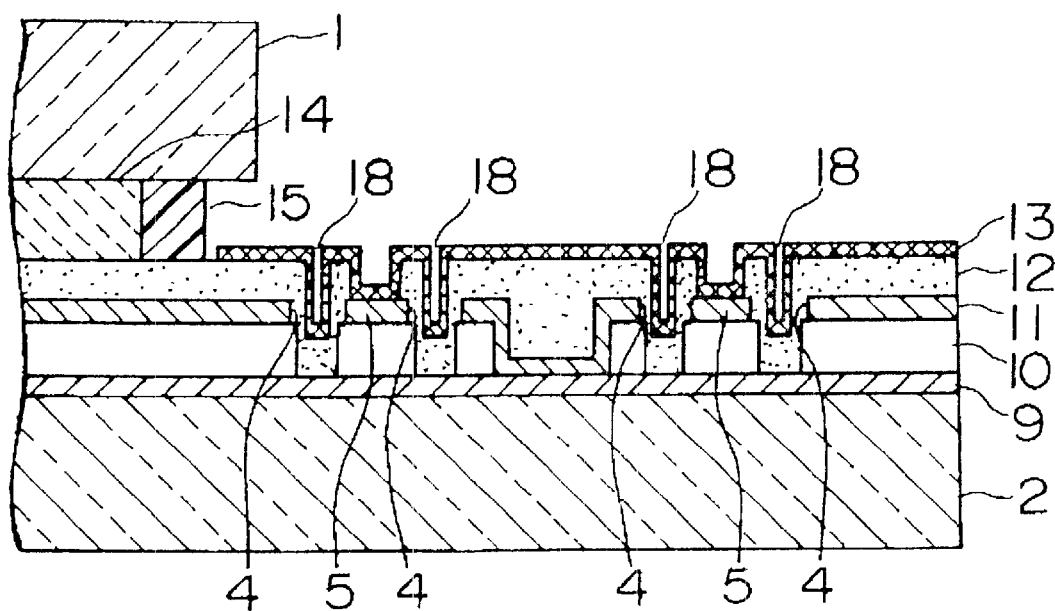
FIG. 7 is a cross-sectional side view showing a connection terminal of a second embodiment according to the present invention.
Figure 8:
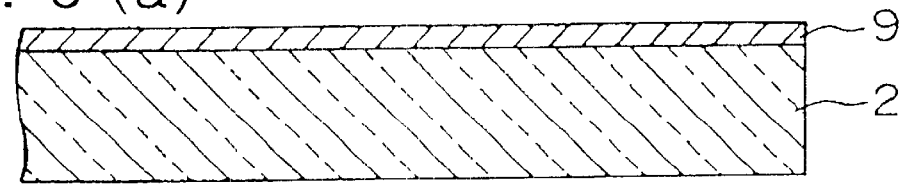
FIGS. 8(*a*) to (*e*) are a cross-sectional side view showing the production steps of the connection terminal according to the second embodiment of the present invention in this order.
Figure 8:
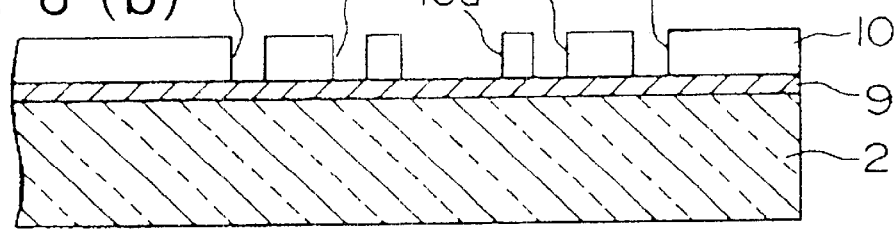
Figure 8:
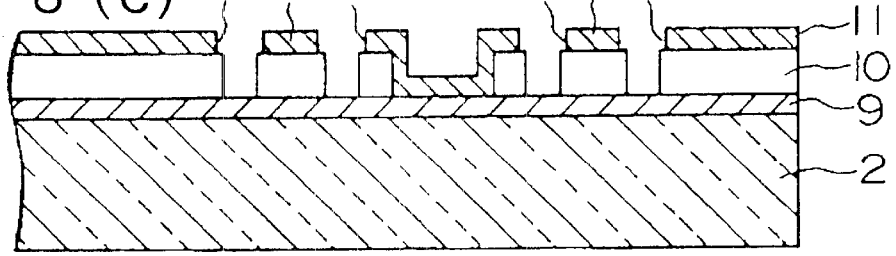
Figure 8:
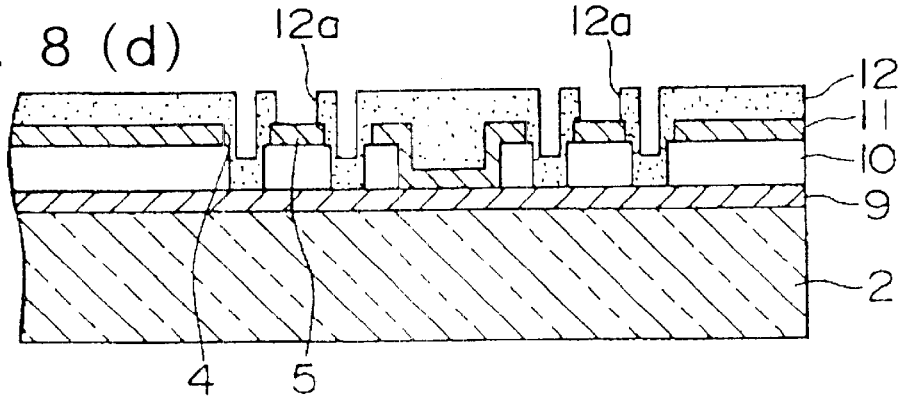
Figure 8:
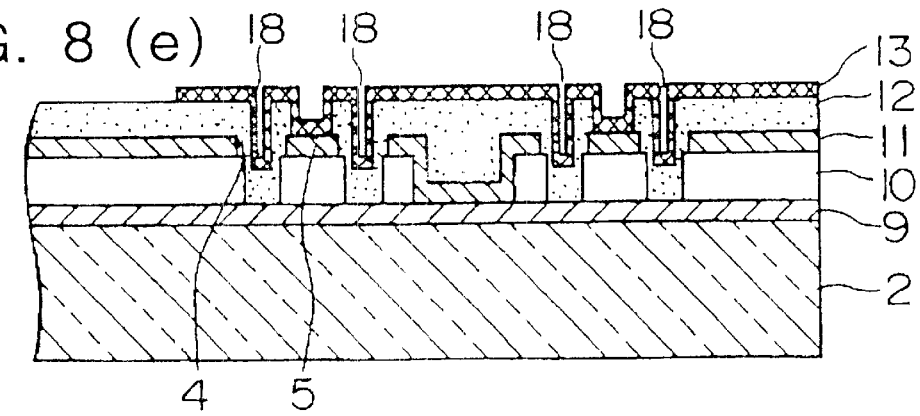

Next, referring to FIGS. 7 and 8 having one or more of cross-sectional view taken in the line A—A of FIG. 2, the second embodiment of the present invention will be explained below. FIG. 7 is a view of the second embodiment of the present invention corresponding to the cross-sectional structure of the terminal in the first embodiment of the present invention shown in FIG. 3. FIG. 8 is a production step diagram regarding the terminal structure shown in FIG. 7. TFT production steps of the second embodiment of the present invention are the same as those of the first embodiment of the present invention. Accordingly, explanation concerning the TFT production steps which have been already explained is omitted here.

Referring to FIG. 8(a), Cr of 200 nm in thickness is deposited on the bottom glass substrate 2 at first by sputtering and then partially removed to form a pattern of lower metal wires 9.

Next, referring to FIG. 8(b), a composite film of silicon oxide and silicon nitride films having a thickness of 500 nm in total is deposited on the lower metal wire 9 by plasma CVD to form an interlaminar insulating film 10. Subsequently, this interlaminar insulating film 10 is partially removed at the predetermined position, wherein the lower metal wire 9 is to be in contact with an upper metal wire 11 which is to be formed in the next step, to form a pattern of a contact hole 10a. At the same time, the interlaminar insulating film 10 around an island pattern to be formed in the upper metal wire 11 is removed to form pool-recesses 18'.

Next, in the step of FIG. 8(c), Cr of 200 nm in thickness is deposited on the interlaminar insulating film 10 and then partially removed to form a pattern of a upper metal wire 11. This upper metal wire 11 becomes able to electrically connect to the lower metal wire 9 through the contact hole 10a formed in the former step.

In this stage, there is formed in the upper metal wire 11 an interterminal anti-short-circuiting pattern, of recesses 4 and conductive islands 5, which are the same with those of the first embodiment of the present invention.

Next, as shown in FIG. 8(d), a silicon nitride film of about 200 nm in thickness is deposited on the upper metal wire 11 by plasma CVD to form a protective insulating film 12. Then, the protective insulating film 12 is partially removed (patterned) to form a contact hole 12a on the connecting spot of the upper metal wire 11 which will be connected to a transparent conductive film 13 to be formed in the next step.

Next, as shown in FIG. 8(e), a transparent conductive film 13 made of ITO having a thickness of 40 nm is formed on the protective insulating film 12 so as to cover the inside of the contact hole 12a. Pools 18 are produced at the location of the pool-recesses 18' in FIG. 8(b).

By way of all the steps as mentioned above, the bottom glass substrate 2 having the connection terminal 3 thereon is manufactured. Subsequently, the resultant bottom glass substrate 2 is adhered to the top glass substrate 1 with a sealing resin 15. Then a liquid crystal 14 is put into the space between the top and bottom glass substrates 1 and 2 to prepare the second embodiment of the liquid crystal display panel having plural connection terminals 3 located around the top glass substrate 1, as shown in FIG. 7.

According to the second embodiment of the present invention, due to the pools 18' provided in addition to the first embodiment of the present invention, corroded metal is captured in the pools 18 and does not spread out into the area between terminals. Accordingly, cause of unacceptable short-circuiting due to interterminal current leak can be effectively inhibited still more as compared with the first embodiment of the present invention.

Figure 9:
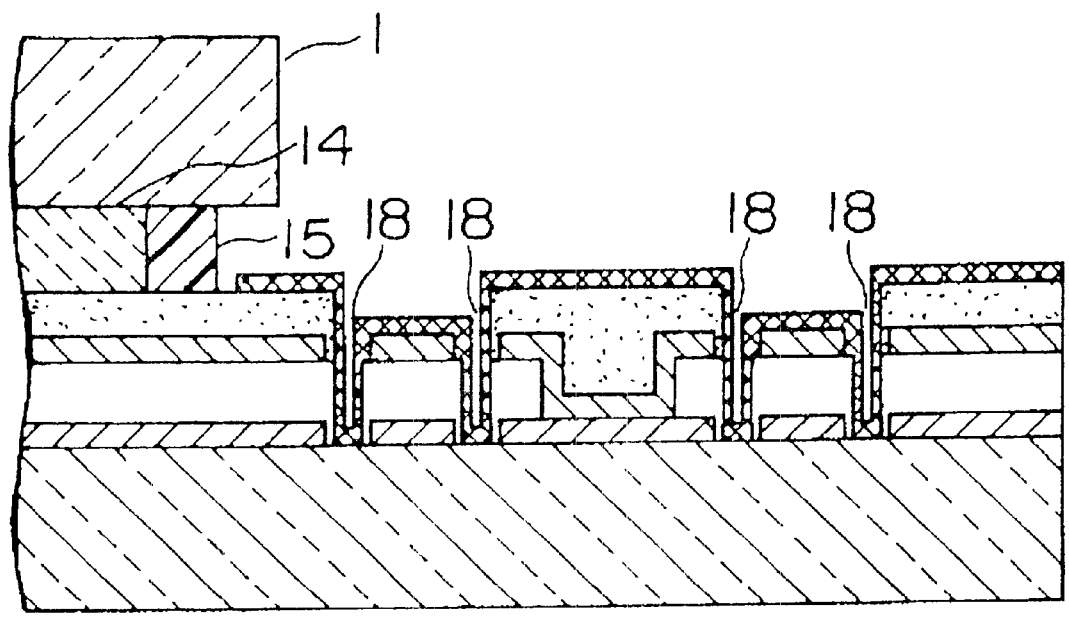
FIG. 9 is a cross-sectional side view showing a connection terminal of a third embodiment according to the present invention.
Figure 10:
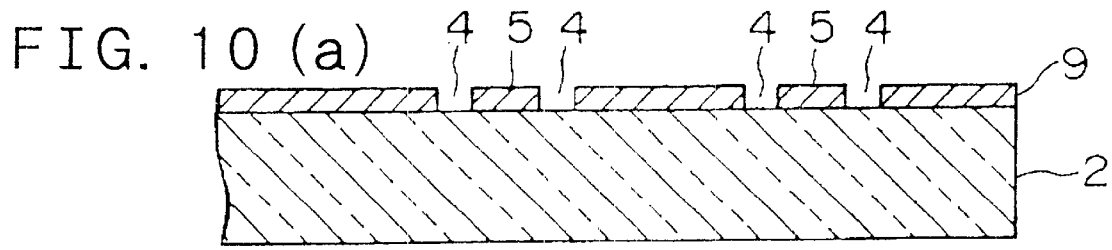
FIGS. 10(a) to (e) are a cross-sectional side view showing the production steps of the connection terminal according to the third embodiment of the present invention in this order.
Figure 10:
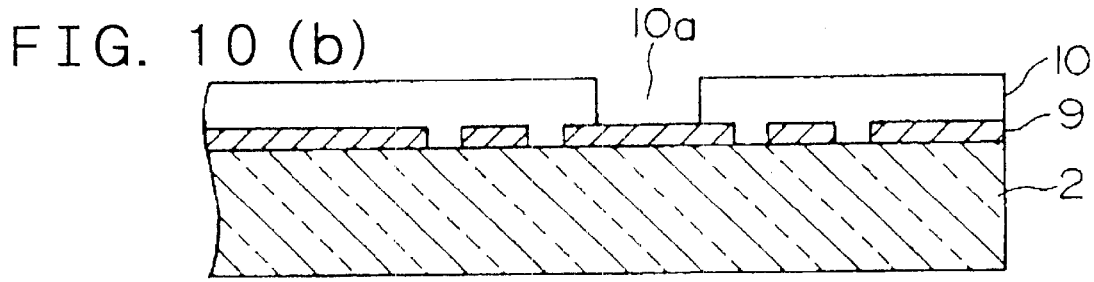
Figure 10:
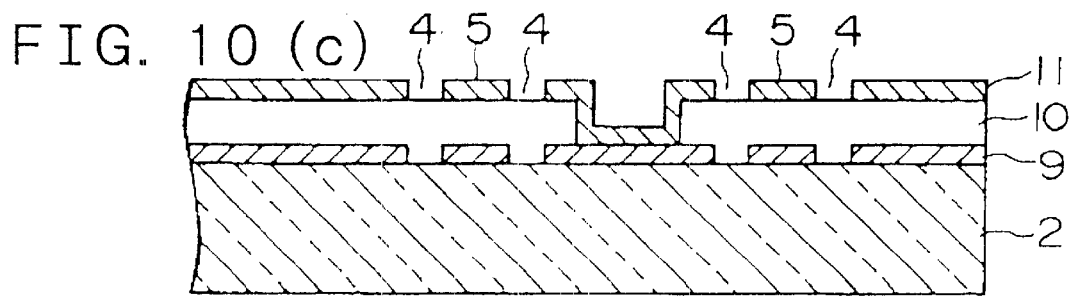
Figure 10:
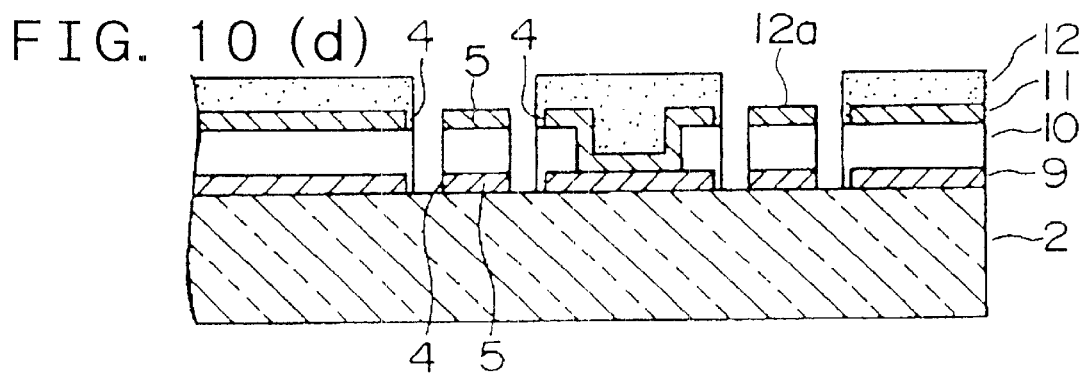
Figure 10:
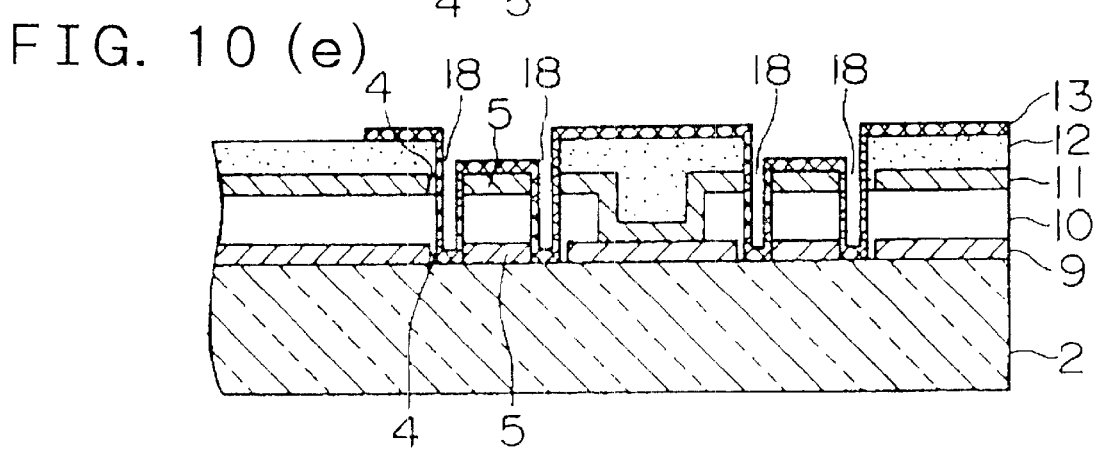
Figure 11:
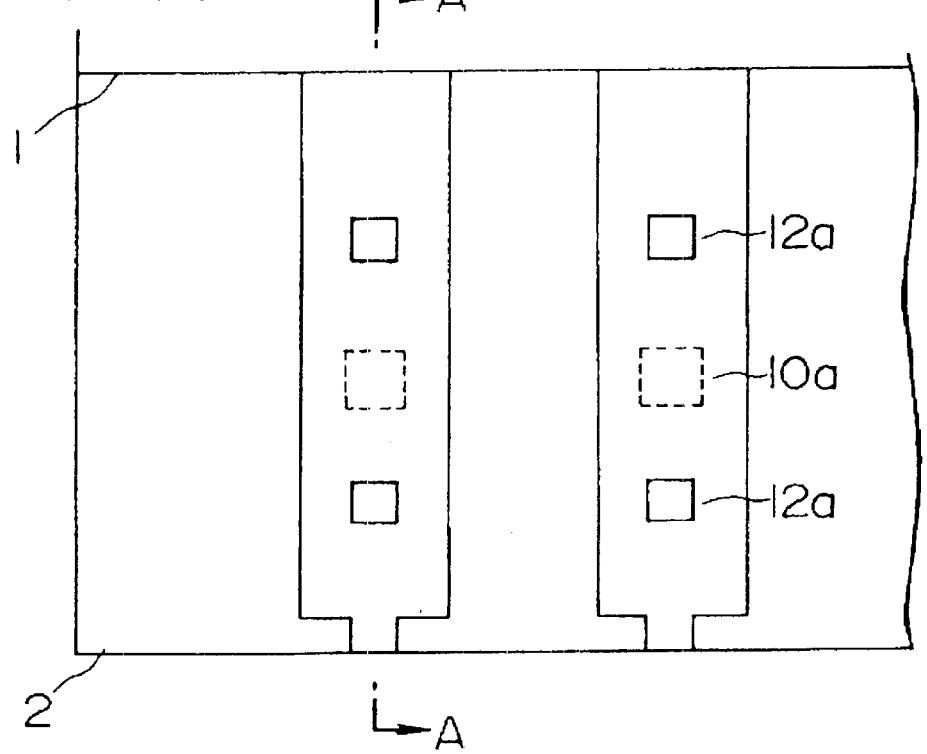
FIG. 11 is an enlarged plan showing a connection terminal in a conventional liquid crystal display panel.
Figure 12:
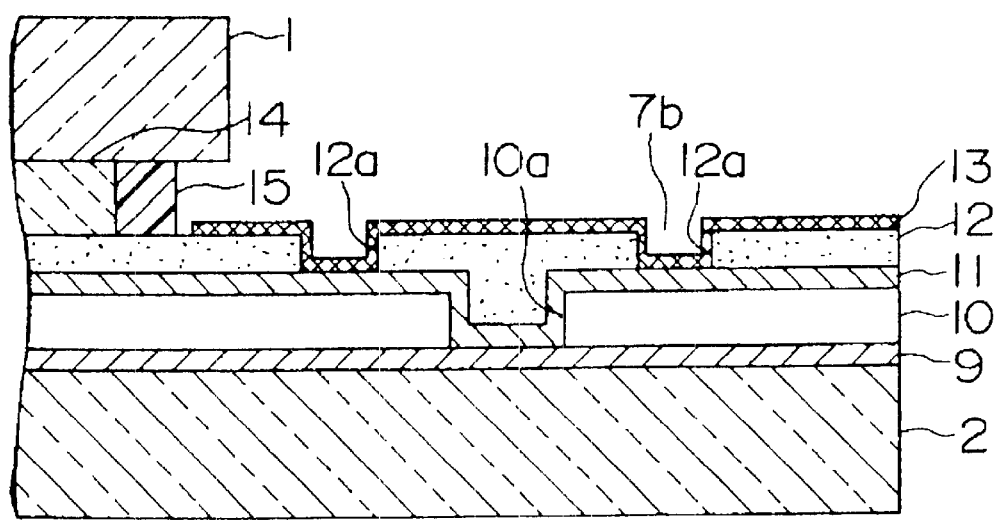
FIG. 12 is a cross-sectional side view taken along the line A—A of FIG. 11 showing an exemplary conventional connection terminal.

Next, referring to FIGS. 9 and 10 having one or more of cross-sectional view taken in the line A—A of FIG. 2, the third embodiment of the present invention will be explained below. FIG. 9 is a view of the third embodiment of the present invention corresponding to the cross-sectional structure of the terminal of the first embodiment of the present invention shown in FIG. 3. FIG. 10 is a production step diagram regarding the terminal structure shown in FIG. 9. TFT production steps of the third embodiment of the present invention are the same as those of the first embodiment of the present invention. Accordingly, explanation concerning the TFT production steps which have been already explained are omitted here.

At first, as shown in FIG. 10(a), Cr of 200 nm in thickness is deposited on the bottom glass substrate 2 by sputtering and then partially removed to form a pattern of lower metal wires 9. During this period of time, in order to produce no unprotected portion uncovered with an insulating film to be formed, the lower metal wire 9 is formed to have an innterterminal anti-short-circuiting pattern of recesses 4 and islands 5. This innterterminal anti-short-circuiting pattern has the same shape with that of a upper metal wire 11 to be formed (see FIG. 10(c)) in the later step.

Next, in the step of FIG. 10(b), a composite film of silicon oxide and silicon nitride films having a thickness of 500 nm in total is deposited on the lower metal wire 9 by plasma CVD to form an interlaminar insulating film 10. Subsequently, this interlaminar insulating film 10 is partially removed at the predetermined position, wherein the lower metal wire 9 is to be in contact with the upper metal wire 11 to be formed in the next step, to form a pattern of a contact hole 10a.

Next, as shown in FIG. 10(c), Cr of 200 nm is deposited on the interlaminar insulating film 10 and then partially removed to form a pattern of the upper metal wire 11. This upper metal wire 11 is connected to the lower metal wire at the position of the contact hole 10a. This upper metal wire 11 is formed to have an innterterminal anti-short-circuiting pattern of recesses 4 and islands 5.

Next, as shown in FIG. 10(d), a silicon nitride film of about 200 nm in thickness is deposited on the upper metal wire 11 by plasma CVD to form a protective insulating film 12. Then, the protective insulating film 12 is partially removed to form a contact hole 12a on the connecting spot of the upper metal wire 11 which will be connected to a transparent conductive film 13 (see FIG. 10(e)) to be formed in the next step. At the same time, the protective insulating film 12 as well as the interlaminar insulating film 10 around the island 5 formed in the upper metal wire 11 are removed by etching to form pools 18.

Subsequently, in the step shown in FIG. 10(e), a transparent conductive film 13 made of ITO having a thickness of 400 is formed and then removed partially so as to cover the connection terminal 3.

In such manners as mentioned above, the bottom glass substrate 2 is manufactured. The resultant bottom glass substrate 2 is adhered to the top glass substrate 1 with a sealing resin 15. Then a liquid crystal 14 is put into the space between the top and bottom glass substrates 1 and 2 to prepare the third embodiment of the liquid crystal display panel shown in FIG. 9.

In the third embodiment of the liquid crystal panel of the present invention, the pools 18 are deep as compared with that of the second embodiment of the present invention. Consequently, corroded metal is fully captured in the pools 18 and does not spread out into the area between terminals. Accordingly, an anti-short-circuiting effect due to interterminal current leak can be improved further more.

The preferable first to third embodiments of the present invention have been set forth. However, these are to be considered illustrative and not restrictive. Other embodiments may be possible. For example, the lower metal wire 9 and the upper metal wire 11 may be a single or laminated layer of any of aluminum, molybdenum, tungsten and the like in place of a single layer of Cr found in the first to third embodiments of the present invention. The material of these metal wires may be different from each other. The interlaminar insulating film 10 and the protective insulating film 12 may also be made of other material than that used in each of the embodiments of the present invention as explained above. Shape and number of the recess 4 and the island 5 forming the interterminal anti-short-circuiting pattern is to be considered not restrictive.

The meritorious effect of the present invention are summarized as follows.

As mentioned above, a semiconductor device and its production process of the present invention is preferable for applying to an active matrix LCD. In the present invention, the connection terminal of a metal wire has an interterminal anti-short-circuiting pattern including an island uncovered with a protective insulating film which is effective to intercept infiltration of water. The metal wire of a metal film except the island area is covered with the protective insulating film. Consequently, even though corrosion appears in the island area, the propagation of corrosion can be intercepted by the recesses located around the island. Moreover, flow of metal eluted from island can also be stopped in the recess and never reaches outside. Accordingly, the occurrence of the interterminal current leak can be effectively inhibited.

Further objects and solutions contained in the present invention will become apparent in the entire disclosure including the appended claims and drawings.

It should be noted that modification obvious in the art may be done without departing the gist and scope of the present invention as disclosed herein and claimed hereinbelow as appended.

What is claimed is:

1. A process for preparing a semiconductor device comprising plural lines of metal wires formed on a substrate each having a connection terminal positioned at the end of said substrate for connecting to an external driving circuit for applying voltage independently to every pixel electrode, comprising the steps of:

depositing a metal film by vacuum deposition or sputtering and removing partially said metal film to form the predetermined pattern of said metal wire;

forming an interterminal anti-short-circuiting pattern, comprising conductive islands and recess(es) located around said islands, at the position of said connection terminal to be formed;

depositing a protective insulating film on the surface of said metal wire except at least a portion of said island but including the inside of said recess thereon to provide a contact hole of the uncovered portion with said protective insulating film on said island; and depositing a transparent conductive film on the surface of said protective insulating film including inside said contact hole and the top face of said island.

* * * * *